(12) United States Patent
Hattori et al.

(10) Patent No.: US 8,273,209 B2
(45) Date of Patent: Sep. 25, 2012

(54) THERMAL DIFFUSION SHEET AND METHOD FOR MOUNTING THE SAME

(75) Inventors: Masakazu Hattori, Aichi (JP); Yoshihiro Fukui, Aichi (JP); Hajime Funahashi, Aichi (JP); Eiichi Natsume, Aichi (JP)

(73) Assignee: Fuji Polymer Industries Co., Ltd., Aichi (JP)

( * ) Notice: Subject to any disclaimer, the term of this patent is extended or adjusted under 35 U.S.C. 154(b) by 379 days.

(21) Appl. No.: 12/624,040

(22) Filed: Nov. 23, 2009

(65) Prior Publication Data
US 2010/0132871 A1 Jun. 3, 2010

(30) Foreign Application Priority Data
Nov. 28, 2008 (JP) ................. 2008-304613

(51) Int. Cl.
*B32B 37/00* (2006.01)
(52) U.S. Cl. ........................... 156/297; 156/60
(58) Field of Classification Search ............ 156/60, 156/297
See application file for complete search history.

(56) References Cited

U.S. PATENT DOCUMENTS

| | | | | |
|---|---|---|---|---|
| 5,192,605 A * | 3/1993 | Mercuri et al. | ............... | 442/417 |
| 7,160,619 B2 * | 1/2007 | Clovesko et al. | ............... | 428/408 |
| 7,166,912 B2 * | 1/2007 | Tzeng et al. | ............... | 257/712 |
| 2001/0045261 A1 * | 11/2001 | Mercuri et al. | ............... | 156/324 |
| 2007/0278212 A1 | 12/2007 | Okimura | | |

FOREIGN PATENT DOCUMENTS

| | | | |
|---|---|---|---|
| JP | 62-294549 A | * | 12/1987 |
| JP | 11-317480 A | | 11/1999 |
| JP | 2000-273426 A | * | 10/2000 |
| JP | 2007-044994 A | | 2/2007 |
| JP | 2007-108547 A | | 4/2007 |
| JP | 2008-028352 A | | 2/2008 |
| KR | 2005019232 A | * | 3/2005 |
| KR | 2006043766 A | * | 5/2006 |

OTHER PUBLICATIONS

Complete Korean Patent 2005-19232, Mar. 2005.*
Machine translation of JP 2000-273426, date unknown.*

* cited by examiner

*Primary Examiner* — Jeff Aftergut
(74) *Attorney, Agent, or Firm* — Hamre, Schumann, Mueller & Larson, P.C.

(57) ABSTRACT

A thermal diffusion sheet of the present invention includes a graphite sheet and thermally conductive adhesive layers attached to both principal surfaces of the graphite sheet. The thermally conductive adhesive layer on a first surface is substantially the same in size as the graphite sheet. The thermally conductive adhesive layer on a second surface is relatively larger in size than the thermally conductive adhesive layer on the first surface, and the entire periphery of the thermally conductive adhesive layer on the second surface lies outside the graphite sheet. The adhesive strength of the thermally conductive adhesive layers on the first and second surfaces after exposure to 40° C. for 168 hours is reduced by no more than 20% relative to the initial adhesive strength. A hardened material of a polymer component of the thermally conductive adhesive layers on the first and second surfaces has a thermal conductivity of 0.6 W/m·K or more. With this configuration, the thermal diffusion sheet has a structure in which the graphite sheet is sealed by attaching the thermally conductive adhesive layer that is larger than the graphite sheet and has a good thermal conductivity in the plane direction to a radiator plate, and can transfer heat to the radiator plate reliably at a low cost.

9 Claims, 4 Drawing Sheets

THERMAL DIFFUSION SHEET AND METHOD FOR MOUNTING THE SAME

BACKGROUND OF THE INVENTION

1. Field of the Invention

The present invention relates to a thermal diffusion sheet that diffuses heat from a thermally conductive component of a semiconductor component such as a light emitting diode (LED) and a heat generating portion of an image display apparatus such a plasma display (PDP) or a liquid crystal display (LCD), and a method for mounting the thermal diffusion sheet.

2. Description of Related Art

A semiconductor such as a computer (CPU), a transistor, or a light emitting diode (LED), a power module, a plasma display (PDP), a liquid crystal display (LCD), etc. generate heat during operation and the performance can decrease due to the heat. For this reason, electronic components that generate heat are provided with a heat dissipating element. A graphite sheet is known to have an excellent thermal conductivity in the plane direction, and thus has been used as a heat dissipating material by utilizing its thermal conductivity. The graphite sheet itself is brittle and cannot be handled easily. Therefore, the graphite sheet is reinforced with a film, which also imparts electrical insulation properties to the graphite sheet. When such a graphite sheet is mounted actually, it needs to be fixed temporarily to a heat generating element or a heat dissipating element. For this purpose, Patent Document 1 proposes the use of a double-sided tape or an adhesive layer that is formed by applying an adhesive directly to the graphite sheet. Patent Documents 2, 3 propose examples in which the graphite sheet is used for the light emitting diode or the liquid crystal display (LCD).

In the case of a semiconductor mounted on an electric circuit, because of the electrical conductivity as well as the brittleness of the graphite sheet, graphite powder may come off the graphite sheet, fall on the electric circuit, and cause a short circuit. To solve this problem, Patent Document 4 proposes that a graphite sheet, supporting films disposed on both sides of the graphite sheet, and spacers attached to the end faces of the graphite sheet are formed integrally together.

However, in Patent Document 4, since the adhesive layer itself has thermal insulation properties, a further improvement in heat conduction is required. In many cases, a general double-sided tape includes a thin film as a core and adhesive layers formed on both sides of the thin film. Although the thin film serves to reinforce the graphite sheet, if the thin film is not present as a core, the graphite sheet absorbs the substances constituting the adhesive layer. Thus, the adhesive strength is reduced due to aging deterioration. In particular, when an adhesive layer is formed directly on the graphite sheet, the phenomenon of reducing the adhesive strength due to aging deterioration is prominent. Moreover, the double-sided tape and the adhesive are likely to have a low thermal conductivity. Therefore, even if the graphite sheet has a high thermal conductivity in the plane direction, such a low thermal conductivity of the material, in which heat is transferred before reaching the graphite sheet, is not desirable for the efficiency of "heat transfer".

In the conventional technology, the double-sided tape, the adhesive, and the insulating film are likely to have a low thermal conductivity, and even if the graphite sheet with a high thermal conductivity in the plane direction is used, such a low thermal conductivity of the material, in which heat is transferred before reaching the graphite sheet, is a problem in the efficiency of "heat transfer".

Patent Document 1: JP 11(1999)-317480 A
Patent Document 2: JP 2007-108547 A
Patent Document 3: JP 2008-028352 A
Patent Document 4: JP 2007-044994 A

SUMMARY OF THE INVENTION

Therefore, with the foregoing in mind, it is an object of the present invention to provide a thermal diffusion sheet that has a structure in which a graphite sheet is sealed by attaching a thermally conductive adhesive layer that is larger than the graphite sheet and has a good thermal conductivity in the plane direction to a radiator plate, and that can transfer heat to the radiator plate reliably at a low cost. It is also an object of the present invention to provide a method for mounting the thermal diffusion sheet.

A thermal diffusion sheet of the present invention includes a graphite sheet and thermally conductive adhesive layers attached to both principal surfaces of the graphite sheet. The thermally conductive adhesive layer on a first surface is substantially the same in size as the graphite sheet. The thermally conductive adhesive layer on a second surface is relatively larger in size than the thermally conductive adhesive layer on the first surface, and the entire periphery of the thermally conductive adhesive layer on the second surface lies outside the graphite sheet. The adhesive strength of the thermally conductive adhesive layers on the first and second surfaces after exposure to 40° C. for 168 hours is reduced by no more than 20% relative to the initial adhesive strength. A hardened material of a polymer component of the thermally conductive adhesive layers on the first and second surfaces has a thermal conductivity of 0.6 W/m·K or more.

A method for mounting a thermal diffusion sheet of the present invention is to mount a thermal diffusion sheet that includes a graphite sheet and thermally conductive adhesive layers attached to both principal surfaces of the graphite sheet on a radiator plate. The thermally conductive adhesive layer on a first surface is substantially the same in size as the graphite sheet. The thermally conductive adhesive layer on a second surface is relatively larger in size than the thermally conductive adhesive layer on the first surface, and the entire periphery of the thermally conductive adhesive layer on the second surface lies outside the graphite sheet. The adhesive strength of the thermally conductive adhesive layers on the first and second surfaces after exposure to 40° C. for 168 hours is reduced by no more than 20% relative to the initial adhesive strength. A hardened material of a polymer component of the thermally conductive adhesive layers on the first and second surfaces has a thermal conductivity of 0.6 W/m·K or more. The method includes the following: attaching the thermally conductive adhesive layer that is substantially the same in size as the graphite sheet to the radiator plate; and sealing the end faces of the graphite sheet by attaching the peripheral portions of the thermally conductive adhesive layer that is relatively larger in size to the radiator plate.

The thermal diffusion sheet of the present invention includes the thermally conductive adhesive layers formed directly on both surfaces of the graphite sheet, has a structure in which the graphite sheet is sealed by attaching the thermally conductive adhesive layer that is larger than the graphite sheet and has a good thermal conductivity in the plane direction to the radiator plate, and can transfer heat to the radiator plate reliably at a low cost. When the thermal diffusion sheet is affixed to the radiator plate, the end faces of the graphite sheet are sealed with the thermally conductive adhesive layer. Therefore, no graphite powder comes off or falls from the end faces of the graphite sheet even after the mounting of the thermal diffusion sheet. This can eliminate the possibility of a short circuit while the thermal diffusion sheet is mounted on an electric circuit. Thus, it is possible to provide a reliable thermal diffusion sheet.

DETAILED DESCRIPTION OF THE INVENTION

Figure 1:
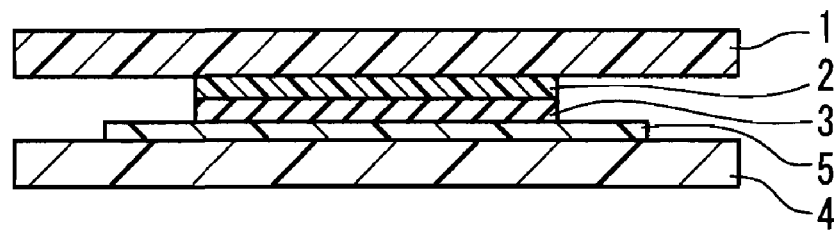
FIG. 1 is a cross-sectional view showing a thermal diffusion sheet of an example of the present invention.

A thermal diffusion sheet of the present invention includes a graphite sheet and thermally conductive adhesive layers attached directly to both principal surfaces of the graphite sheet. The thermally conductive adhesive layer on a first surface is substantially the same in size as the graphite sheet. The thermally conductive adhesive layer on a second surface is relatively larger in size than the thermally conductive adhesive layer on the first surface, and the entire periphery of the thermally conductive adhesive layer on the second surface lies outside the graphite sheet. The thermally conductive adhesive layer that is substantially the same in size as the graphite sheet is attached to a radiator plate, and then the peripheral portions of the thermally conductive adhesive layer that is relatively larger in size are attached to the radiator plate, thereby sealing the end faces of the graphite sheet. In this case, the term "substantially" indicates ±1 mm or less.

It is preferable that the thermally conductive adhesive layer is a composition including a polymer component and a thermally conductive filler. The polymer component is preferably polysiloxane (silicone polymer), polyacrylic, or polyolefin. In view of heat resistance and ease of filling, polysiloxane is suitable. However, there are some cases where polysiloxane is not acceptable depending on the intended use. Therefore, the polymer component may be selected appropriately in accordance with the intended use. The polymer component preferably has rubber elasticity after curing, but can be like an adhesive with shape retention. In particular, a silicone adhesive includes a resin, which is a kind of polysiloxane, and gum and has higher heat resistance than polyacrylic and polyolefin.

The thermally conductive filler is, e.g., a metal oxide or ceramic powder and preferably has electrical insulation properties. The metal oxide and the ceramic powder have a variety of types and shapes, and known materials can be used. Moreover, an insulating film may be used to impart electrical insulation properties to a non-insulated filler.

It is preferable that 100 to 3000 parts by weight of the thermally conductive filler are added to 100 parts by weight of the polymer component. If the amount of the filler is too large, the adhesion of the thermally conductive adhesive layer is reduced. Therefore, it is important to balance the amount of the filler and the thermal conductivity.

A plasticizer may be added to the polymer component as needed. However, since the graphite sheet is likely to absorb oil, the composition of the thermally conductive adhesive layer attached to the graphite sheet may be changed to reduce the adhesion. Therefore, it is necessary to avoid the use of the oil as a plasticizer as much as possible.

Other than the filler, a fire retardant, a heat-resisting agent, a pigment, a vulcanizing agent, or a curing agent may be added to the polymer component.

The graphite sheet may be produced by forming a polymer film into graphite or forming a natural graphite powder or an expanded graphite powder into a sheet by rolling. The former can provide a graphite sheet with a high thermal conductivity in the plane direction and the latter can provide a graphite sheet at low cost. The graphite sheet requires some degree of thermal conductivity when used for thermal diffusion. Therefore, it is preferable that the graphite sheet is produced by forming a natural graphite powder or an expanded graphite powder into a sheet by rolling.

It is preferable that the entire periphery of the relatively large thermally conducive adhesive layer lies at least 1 mm, more preferably 2 to 10 mm, and particularly preferably 3 to 5 mm outside the graphite sheet for the ease of transfer and complete sealing of the end faces of the graphite sheet. In this case, the entire periphery of the thermally conductive adhesive layer lying at least 1 mm outside the graphite sheet means the following. For example, if the graphite sheet is quadrilateral, each end of the side of the thermally conductive adhesive layer is at least 1 mm longer than that of the graphite sheet. In another example, if the graphite sheet is circular, the radius of the thermally conductive adhesive layer is at least 1 mm longer than that of the graphite sheet.

The thickness of the thermally conductive adhesive layer is preferably 0.1 to 5.0 mm. The thickness of the graphite sheet is preferably 60 to 500 µm. Accordingly, the total thickness of the product is 0.26 to 10.5 mm, but more preferably 0.1 to 1.5 mm. This range is suitable for the thermal diffusion sheet that is incorporated into a heat generating component such as a semiconductor.

It is preferable that the adhesive strength of the thermally conductive adhesive layers on both surfaces of the graphite sheet after exposure to 40° C. for 168 hours is reduced by no more than 20% relative to the initial adhesive strength. Consequently, the adhesive strength can be maintained for a long time. It is more preferable that the adhesive strength after exposure is reduced by no more than 10% relative to the initial adhesive strength. Moreover, the initial adhesive strength of the thermally conductive adhesive layers is preferably 0.5 to 10.0 N/cm. With this range, the thermal diffusion sheet can be affixed to the radiator plate easily and does not peel off easily.

When the polymer component is polysiloxane (silicone polymer), the above adhesive strength of the thermally conductive adhesive layers can be achieved by mixing and curing the following: (A) vinyl-containing linear silicone; (B) a silicone resin that has no vinyl functionality and is compatible with (A); (C) silicone having an average of 2.5 to 4 SiH groups per molecule, in which a ratio of the SiH group to the vinyl group is 0.3 to 3.0; (D) a platinum catalyst; and (E) a thermally conductive filler.

The thermally conductive adhesive layers on both surfaces of the graphite sheet may be either the same or different in material. For example, the adhesive strength of the thermally conductive adhesive layer on the first surface may differ from that of the thermally conductive adhesive layer on the second surface. It is preferable that the adhesive strength of the thermally conductive adhesive layer on the first surface that is substantially the same in size as the graphite sheet is 1 to 10 times higher than that of the thermally conductive adhesive layer on the second surface that is larger than the graphite sheet.

Moreover, the thermally conductive adhesive layers on both surfaces of the graphite sheet may be different in hardness. It is preferable that the hardness of the thermally conductive adhesive layer on the first surface that is substantially the same in size as the graphite sheet is 0.5 to 2 times higher than that of the thermally conductive adhesive layer on the second surface that is larger than the graphite sheet.

It is preferable that the graphite sheet has a thermal conductivity of 120 W/m·K or more in the lateral direction, since the thermal diffusion can be improved further.

It is preferable that the graphite sheet has an emissive power of 0.3 to 0.95 at 40° C. This is because a high emissive power can increase the possibility that heat is dissipated into the air as infrared radiation. The emissive power of the portions other than the graphite sheet, e.g., the double-sided tape and the rubber is preferably 0.5 or more.

It is preferable that the thermally conductive adhesive layers include a compound obtained by adding a thermally conductive filler to the polymer component that is at least one selected from polysiloxane (silicone polymer), polyacrylic, and polyolefin. A hardened material of the compound preferably has a thermal conductivity of 0.6 W/m·K or more. If the thermal conductivity is 0.6 W/m·K or more, heat from a heat generating component such as a semiconductor can be diffused and transferred efficiently. This thermal conductivity can be determined by the type and amount of the polymer component and the thermally conductive filler.

It is preferable that the thermal diffusion sheet has a thermal resistance value of 0.2 to 5.0° C.·cm$^2$/W and electrical insulation properties expressed as 200 MΩ or more. If the thermal resistance value falls in the above range, heat from a heat generating component such as a semiconductor can be diffused and transferred efficiently. Moreover, if the electrical insulation properties fall in the above range, a short circuit can be prevented. This thermal resistance value can be determined by the type and amount of the polymer component and the thermally conductive filler.

The emissive power of the graphite sheet varies depending on the manufacturing method of the graphite sheet. If the graphite sheet is formed by rolling or the like, it has a mirror-finished surface, so that the emissive power is reduced. The emissive power of a polymeric material such as a tape is 50% or more. In recent years, a thermograph often is used for heat control. When the thermograph is used without setting the emissive power, an accurate thermal analysis cannot be performed. Therefore, specifying the emissive power will help the thermal analysis.

The thermally conductive adhesive layers may be formed on the graphite sheet by any means including a knife coater, rolling, pressing, lamination, and screen printing. In some cases, the thermally conductive adhesive material may be diluted with a solvent etc. to provide an ink, and the ink may be applied to the graphite sheet.

A primer treatment may be performed as needed to strengthen the adhesion between the graphite sheet and the thermally conductive adhesive layers. The primer treating agent can be selected in accordance with the type of the polymer.

A plurality of the thermal diffusion sheets may be arranged regularly on a long release film and wound around a reel. Although there are various ways of winding the thermal diffusion sheets around the reel, it is preferable that the thermal diffusion sheets are held on the long release film due to the self adhesiveness, arranged regularly while being cut or punched into a predetermined size, and finally provided in the form of winding. This can automate the process of affixing the thermal diffusion sheets.

Next, the present invention will be described with reference to the drawings. FIG. 1 is a cross-sectional view showing a thermal diffusion sheet of an example of the present invention. The thermal diffusion sheet includes a graphite sheet 3 and thermally conductive adhesive layers 2, 5 attached directly to both surfaces of the graphite sheet 3. The thermally conductive adhesive layer 2, which is on one side of the graphite sheet 3, is substantially the same in size as the graphite sheet 3. The thermally conductive adhesive layer 5, which is on the other side of the graphite sheet 3, is relatively larger in size than the thermally conductive adhesive layer 2, and all the four sides of the thermally conductive adhesive layer 5 lie outside the graphite sheet 3. Reference numerals 1, 4 denote protective sheets. The protective sheet 1 is preferably an embossed polyethylene film. The protective sheet 4 is preferably a polyester film that has been subjected to a release treatment.

Figure 2:
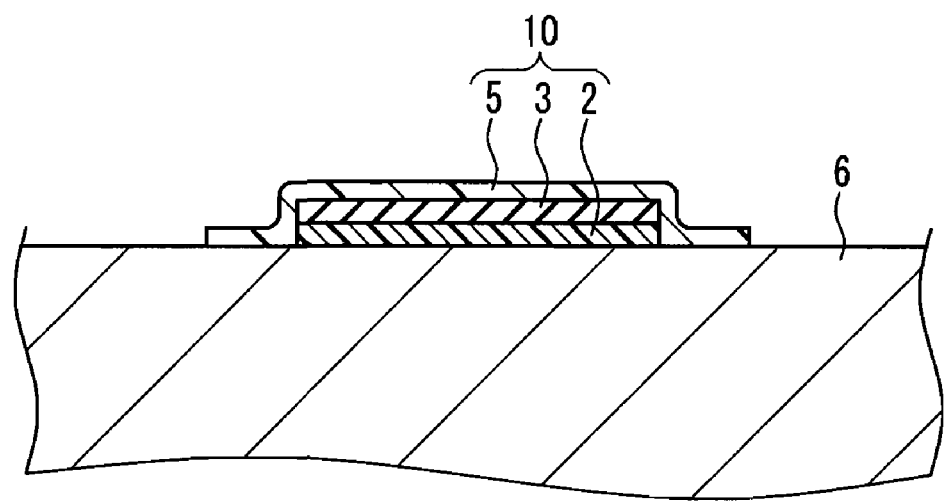
FIG. 2 is a cross-sectional view showing a state in which a thermal diffusion sheet of an example of the present invention is affixed to a radiator.

When the thermal diffusion sheet is affixed to a radiator, as shown in FIG. 2, first, the protective sheet 1 is removed and the thermally conductive adhesive layer 2 is attached to the radiator 6. Then, the thermal diffusion sheet is pressed from the top of the protective sheet 4 by hand, and subsequently the protective sheet 4 is removed. As a result, the end faces of the graphite sheet 3 are sealed. In FIG. 2, reference numeral 10 denotes the thermal diffusion sheet.

EXAMPLES

Hereinafter, the present invention will be described in detail by way of examples. The present invention is not limited to the following examples.

The thermally conductive adhesive layers were prepared in the following manner.

(Thermally Conductive Adhesive Material A)

200 parts by weight of alumina (AS20 manufactured by SHOWADENKO K.K.) and 5 parts by weight of iron oxide were added to 100 parts by weight of silicone polymer (XE14-C2068 manufactured by Momentive Performance Materials Inc.), and the mixture was stirred with a planetary mixer for 10 minutes while reducing foam, thus producing a composition.

(Thermally Conductive Adhesive Material B)

200 parts by weight of alumina (AS20 manufactured by SHOWADENKO K.K.), 5 parts by weight of crosslinking agent (CR 300 manufactured by KANEKA CORPORATION), 0.3 parts by weight of platinum catalyst (PT-VTSC-3.0 IPA manufactured by UMICORE JAPAN K.K.), 0.1 parts by weight of retardant (SURFYNOL 61 manufactured by Nisshin Chemical Industry Co., Ltd.), and 5 parts by weight of iron oxide were added to 100 parts by weight of polyisobutylene polymer (EP200A manufactured by KANEKA CORPORATION), and the mixture was stirred with a planetary mixer for 10 minutes while reducing foam, thus producing a composition.

(Thermally Conductive Adhesive Material C)

100 parts by weight of alumina (AS20 manufactured by SHOWADENKO K.K.), 5 parts by weight of iron oxide, and 80 parts by weight of xylene were added to 110 parts by weight of silicone adhesive (TSR1510 manufactured by Momentive Performance Materials Inc.), and the mixture was stirred with a planetary mixer for 10 minutes, thus producing a coating liquid.

(Thermally Conductive Adhesive Material D)

100 parts by weight of alumina (AS20 manufactured by SHOWADENKO K.K.), 0.1 parts by weight of crosslinking agent (TSF484 manufactured by Momentive Performance Materials Inc.), and 5 parts by weight of iron oxide were added to 100 parts by weight of silicone polymer (XE14-C2068 manufactured by Momentive Performance Materials Inc.), and the mixture was stirred with a planetary mixer for 10 minutes while reducing foam, thus producing a composition.

(Adhesive Material E)

50 parts by weigh of xylene were added to 110 parts by weight of silicone adhesive (TSR1510 manufactured by Momentive Performance Materials Inc.), thus producing a coating liquid.

Table 1 shows the physical properties of the thermally conductive adhesive materials A to D and the adhesive material E.

TABLE 1

| | Experiment number | | | | |
|---|---|---|---|---|---|
| | 1 | 2 | 3 | 4 | 5 |
| Adhesive material | Thermally conductive adhesive material A | Thermally conductive adhesive material B | Thermally conductive adhesive material C | Thermally conductive adhesive material D | Adhesive material E |
| Hardness | 25 | 50 | — | 60 | — |
| Thermal conductivity (W/m · K) | 0.7 | 0.7 | 0.7 | 0.5 | 0.2 |
| Adhesive strength (N/cm) | 3.2 | 3.2 | 1.9 | 1 | 4.5 |

(Note)
Hardness: ASTM D2240, measured by type C
Thermal conductivity: ASTM D5470
Adhesive strength: JIS Z0237 (where the material to which the thermally conductive adhesive layer adhered was an aluminum plate)

Test samples for measuring the adhesive strength were produced in the following manner.

(Experiment Numbers 1 and 2)

The thermally conductive adhesive material was sandwiched between a polyester film that had been subjected to a release treatment with fluorine and a 100 μm thick non-treated polyester film, pressed from the non-treated polyester film side at a pressure of 5 MP, and then heated at 120° C. for 60 minutes. After cooling, the fluorine-treated polyester film was removed, so that the thermally conductive adhesive layer with a thickness of 0.2 mm was attached to the non-treated polyester film.

(Experiment Numbers 3, 4 and 5)

The coating liquid was applied to a 100 μm thick non-treated polyester film by knife coating, air-dried for 30 minutes, and hardened at 120° C. for 10 minutes. The resultant adhesive layer had a thickness of 50 μm.

In addition to the thermally conductive adhesive materials A to D and the adhesive material E, graphite sheets (TYK graphite sheet manufactured by Akechi Ceramics Co., Ltd.) with thicknesses of 80 μm and 250 μm were prepared. Both graphite sheets had a thermal conductivity of 400 W/m·K and an emissive power of 0.40. The emissive power was determined as an integrated emissive power at a surface temperature of 40° C. using a Fourier transform infrared spectrophotometer (FT-IR, JIR-5500 type equipped with infrared radiation unit IR-IRR200 manufactured by JEOL Ltd., detector: MCT, measurement wavelength: 4.5 to 20 μm, resolving power: 16 cm$^{-1}$, and cumulative number: 500). Next, the thermal diffusion sheets were produced in the following manner.

Examples 1 to 4

Figure 4A:
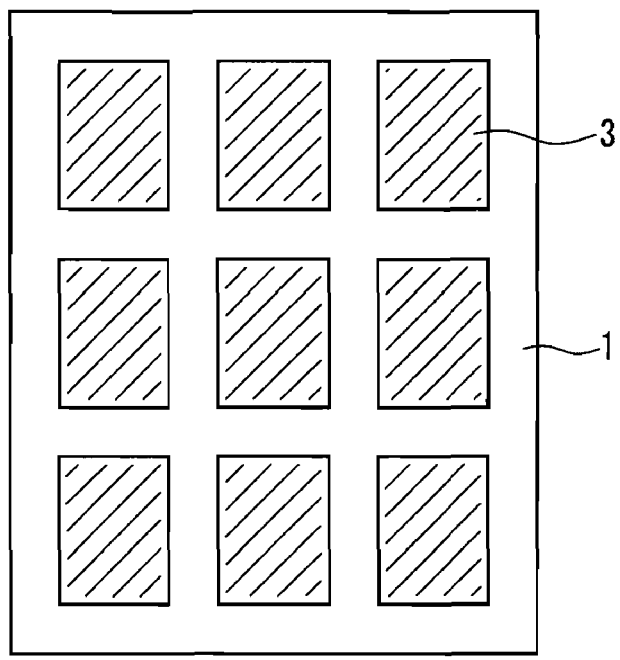
FIG. 4A is a plan view showing a manufacturing process of a thermal diffusion sheet of an example of the present invention.
Figure 4B:
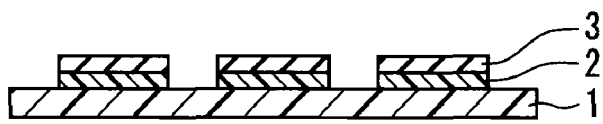
FIG. 4B is a cross-sectional view of FIG. 4A.
Figure 5:
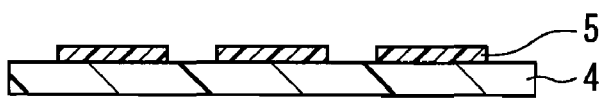
FIG. 5 is a cross-sectional view showing a manufacturing process of a thermal diffusion sheet of an example of the present invention.

In Examples 1 to 4, the graphite sheet was sandwiched between the thermally conductive adhesive layers that were the same in type but different in size. The thermally conductive adhesive layer made of the material A (Examples 1 and 2) or B (Examples 3 and 4) was formed on a polyester film that had been subjected to a release treatment with fluorine, and was laminated with the graphite sheet. Then, the thermally conductive adhesive layer made of the material A (Examples 1 and 2) or B (Examples 3 and 4) with a thickness of 0.25 mm was disposed on the graphite sheet. Specifically, referring to FIGS. 4A and 4B, the thermally conductive adhesive layer 2 was formed on the polyester film 1. The graphite sheet 3 having the same size as the thermally conductive adhesive layer 2 was aligned with and laminated on the thermally conductive adhesive layer 2. Moreover, the thermally conductive adhesive layer 5 was formed on a polyester film that had been subjected to a release treatment with fluorine, and was die-cut so that each of the four sides of the thermally conductive adhesive layer 5 was 5 mm longer than that of the graphite sheet 3 shown in FIGS. 4A and 4B. Subsequently, burrs were removed. The graphite sheet was 100 mm long and 25 mm wide and had a thickness as shown in Table 2. In FIG. 5, reference numeral 4 denotes the fluorine-treated polyester film and 5 denotes the thermally conductive adhesive layer. The laminated sheet of FIGS. 4A and 4B and the laminated sheet of FIG. 5 were bonded together, resulting in the laminated sheet of FIG. 1.

The properties of the thermal diffusion sheets thus produced are shown in Table 2.

Comparative Examples 1 to 4

The adhesive material E or the thermally conductive adhesive material C was applied to each of the graphite sheets with different thicknesses by knife coating, air-dried for 30 minutes, and hardened at 120° C. for 10 minutes. The resultant adhesive layer had a thickness of 50 μm. Then, a fluorine release film was attached to the adhesive surface of the adhesive layer. Specifically, referring to FIG. 1, the adhesive layer 2 made of the material E or C was disposed on the graphite sheet 3, and the polyester film 1 was attached to the adhesive layer 2. The other processes were the same as those of Examples 1 to 4.

Table 2 shows the experimental results of the thermal diffusion sheets produced by the above methods.

TABLE 2

| | Ex. 1 | Ex. 2 | Ex. 3 | Ex. 4 | Comp. Ex. 1 | Comp. Ex. 2 | Comp. Ex. 3 | Comp. Ex. 4 |
|---|---|---|---|---|---|---|---|---|
| Type of thermally conductive adhesive material | Thermally conductive adhesive material A | | Thermally conductive adhesive material B | | Adhesive material E | | Thermally conductive adhesive material C | |
| Base material of thermally conductive adhesive material | Silicone gel | | Polyisobutylene | | Silicone adhesive material | | Silicone adhesive material | |
| Presence or absence of filler in thermally conductive adhesive material | present | | present | | absent | | present | |
| Graphite thickness (μm) | 80 | 250 | 80 | 250 | 80 | 250 | 80 | 250 |
| Thermal resistance value (° C. · cm²/W) | 0.61 | 1.05 | 0.70 | 1.20 | 3.21 | 6.5 | 0.58 | 0.96 |
| LED temperature (° C.) | 82 | 84 | 85 | 88 | 105 | 106 | 80 | 82 |
| Adhesive strength (N/cm) initial state | 3.2 | 3.2 | 2.1 | 1.9 | 4.5 | 4.5 | 1.9 | 1.9 |
| Adhesive strength (N/cm) after exposure | 3 | 3 | 1.9 | 1.8 | 3.2 | 3.2 | 0 | 0 |

The measurements were performed in the following manner.

(Thermal Resistance Value)

The thermal resistance value was measured in accordance with ASTM D5470.

(LED Temperature)

A circuit was formed with a 5 W LED and a power supply (current: 0.6 A, voltage: 10 V). The thermal diffusion sheet of 100 mm long and 25 mm wide produced in each of Examples 1 to 4 and Comparative Examples 1 to 4 was placed in the center of a stainless steel plate with a width of 35 mm, a length of 110 mm, and a thickness of 5 mm. The single LED was fixed by utilizing the adhesiveness of the thermal diffusion sheet. The LED had a width of 8 mm, a length of 10 mm, and a thickness of 2.5 mm and was fixed in the center (central portion) of the thermal diffusion sheet (of 100 mm long and 25 mm wide). The temperature of the LED was measured with a thermograph (manufactured by Apiste Corporation) two hours after the power supply was turned on.

(Adhesive Strength)

The adhesive strength was measured in accordance with JIS Z0237 where the material to which the thermal diffusion sheet adhered was an aluminum plate. The thermal diffusion sheet of 100 mm long and 25 mm wide produced in each of Examples 1 to 4 and Comparative Examples 1 to 4 was put in a circulating hot air oven at 100° C. for 168 hours with the adhesive surface being exposed and facing up.

Examples 5 and 6

In Examples 5 and 6, the graphite sheet was sandwiched between the thermally conductive adhesive layers that were different in both type and size. The thermally conductive adhesive material D was applied to the graphite sheet by knife coating, air-dried for 30 minutes, and hardened at 120° C. for 10 minutes. The resultant adhesive layer had a thickness of 50 μm. Then, a fluorine release film was attached to the adhesive surface of the adhesive layer. This was die-cut from the graphite sheet side with a punching die 7 shown in FIG. 3 by using the polyester film (i.e., the fluorine release film) on the adhesive layer as a release liner. Subsequently, burrs were removed. FIGS. 4A and 4B are a plan view and a cross-sectional view of the laminated sheet thus produced, respectively. In FIGS. 4A and 4B, reference numeral 1 denotes the fluorine-treated polyester film, 2 denotes the thermally conductive adhesive layer made of the material D, and 3 denotes the graphite sheet.

Figure 3:
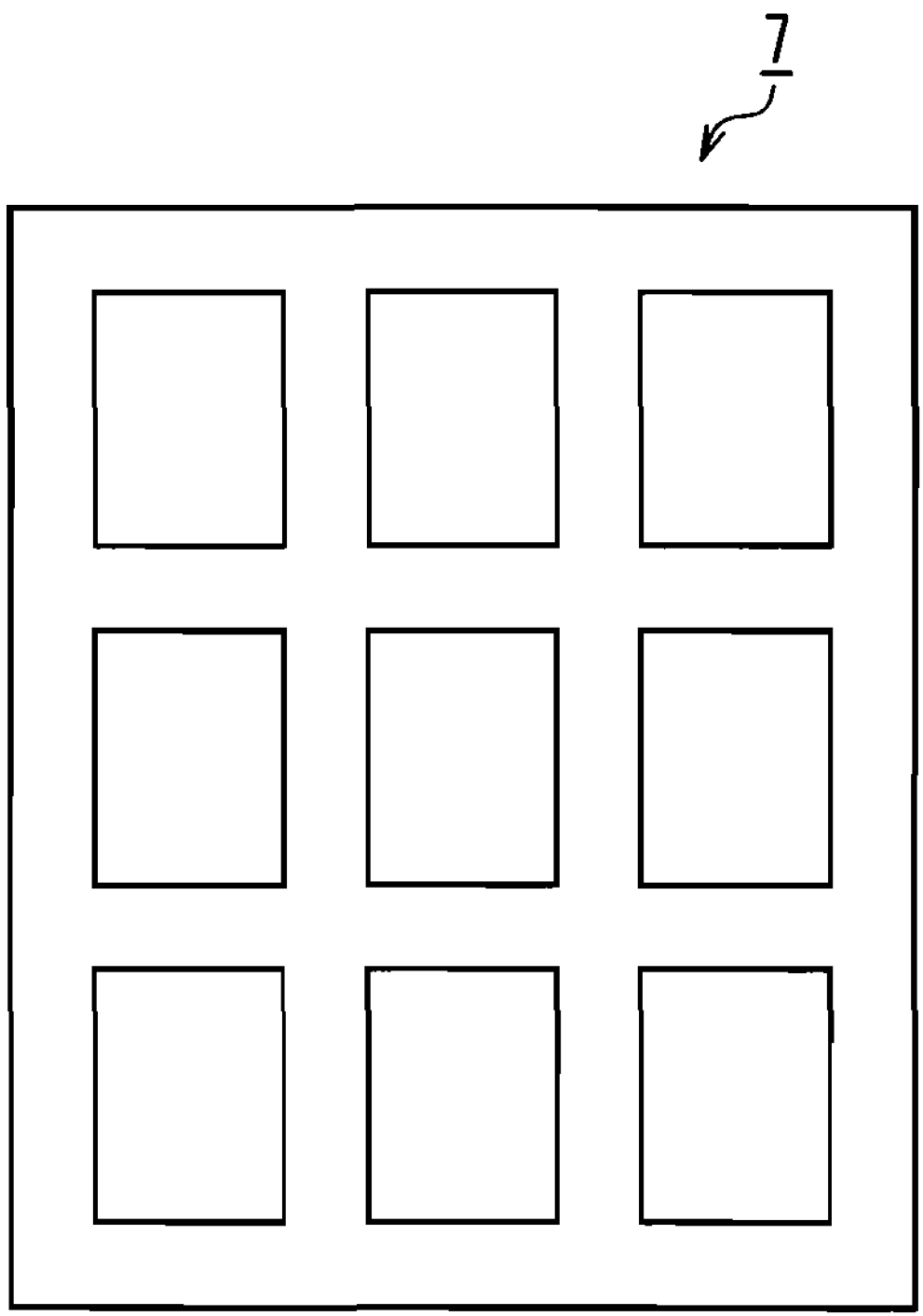
FIG. 3 is a plan view showing a punching die used in a manufacturing process of a thermal diffusion sheet of the same example.

The thermally conductive adhesive layer made of the material A provided on a polyester film that had been subjected to a release treatment with fluorine was die-cut with a punching die in which each of the four sides of the blades was 5 mm longer than that of the blades of the punching die 7 in FIG. 3. Subsequently, burrs were removed. The graphite sheet was 100 mm long and 25 mm wide and had a thickness as shown in Table 3. In FIG. 5, reference numeral 4 denotes the fluorine-treated polyester film and 5 denotes the thermally conductive adhesive layer made of the material A. The laminated sheet of FIGS. 4A and 4B and the laminated sheet of FIG. 5 were bonded together, resulting in the laminated sheet of FIG. 1.

Figure 6A:
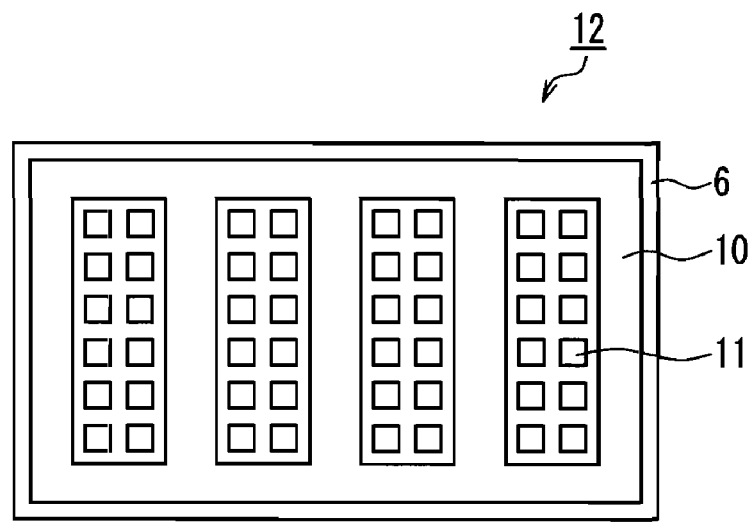
FIG. 6A is a plan view showing a state in which a thermal diffusion sheet of an example of the present invention is affixed to a radiator.
Figure 6B:
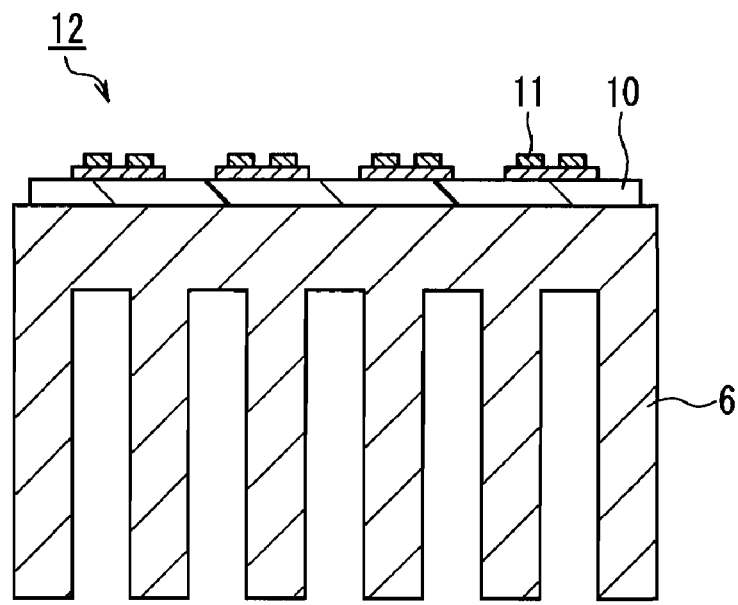
FIG. 6B is a cross-sectional view of FIG. 6A.

FIGS. 6A and 6B show an example of applying the above thermal diffusion sheet 10 to a radiator 6 and light bars 11 including LEDs. FIG. 6A is a plan view showing the thermal diffusion sheet 10 interposed between the light bars 11 and the radiator 6. FIG. 6B is a cross-sectional view of FIG. 6A. In FIGS. 6A and 6B, reference numeral 12 denotes a heat dissipating apparatus. The thermal diffusion sheet 10 was affixed to the radiator 6 as shown in FIG. 2. The heat generated from the light bars 11 was transferred efficiently to the radiator 6 through the thermal diffusion sheet 10. The thermal diffusion sheet 10 also was excellent in temperature equalization.

Comparative Examples 5 and 6

In Comparative Examples 5 and 6, a thermal diffusion sheet was produced in such a manner that a double-sided tape was provided on one side of the graphite sheet and a single-sided adhesive film was provided on the other side of the graphite sheet. Specifically, the double-sided tape with a thickness of 30 μm was attached to one side of the graphite sheet and the single-sided adhesive film with a thickness of 30 μm was attached to the other side of the graphite sheet.

Table 3 shows the conditions and results in Examples 5, 6 and Comparative Examples 5, 6.

TABLE 3

|  | Ex. 5 | Ex. 6 | Comp. Ex. 5 | Comp. Ex. 6 |
|---|---|---|---|---|
| Type of thermally conductive adhesive material | Thermally conductive adhesive material A and thermally conductive adhesive material D | | 30 μm thick double-sided tape and 30 μm thick single-sided adhesive film | |
| Graphite thickness (μm) | 80 | 250 | 80 | 250 |
| Thermal resistance value (° C. · cm²/W) | 0.8 | 1.53 | 0.95 | 1.84 |
| LED temperature (° C.) | 81 | 82 | 84 | 88 |
| Insulation properties (Ω) | 200 M or more | 200 M or more | 200 M or more | 200 M or more |

(Insulation Properties)

A resistance value was measured with an ohmmeter when a terminal was brought into contact with the end face of the thermal diffusion sheet.

(Discussion)

(1) In Examples 1 and 2, the thermally conductive adhesive material was disposed directly on the graphite sheet. Although the thermally conductive adhesive material was disposed directly on the graphite sheet, a decrease in the adhesive strength over time was small. In Comparative Examples 1 and 2, the silicone adhesive was applied directly to the graphite sheet. Since the graphite sheet absorbed the plasticizer contained in the silicone adhesive, the adhesive strength was decreased over time.

(2) In Examples 1 and 2, the filler was added to the silicone rubber, which is a kind of silicone polymer. In Comparative Examples 3 and 4, the filler was added to the silicone adhesive, which is a kind of silicone polymer. Although the filler was added to the polymer components in both of these examples, a decrease in the adhesive strength over time was small in Examples 1 and 2. In contrast, the adhesive strength was decreased significantly over time in Comparative Examples 3 and 4. That is, the amount of the filler added to the base polymer was larger, but a decrease in the adhesive strength over time was smaller in Examples 1 and 2 than in Comparative Examples 3 and 4.

Similarly, Examples 3 and 4 used the isobutylene polymer as a polymer component and were able to suppress a decrease in the adhesive strength over time. Thus, the amount of the filler added to the base polymer was larger, but a decrease in the adhesive strength over time was smaller in Examples 3 and 4 than in Comparative Examples 3 and 4.

(3) The thermal conductivity of the thermally conductive adhesive materials was higher in Examples 1 to 6 than in Comparative Examples 1 and 2. Therefore, the thermal resistance value was lower in Examples 1 to 6 than in Comparative Examples 1 and 2. Accordingly, the LED temperature was lower in Examples 1 to 6 than in Comparative Examples 1 and 2.

(4) The LED temperature was slightly higher in Examples 1 to 4 than in Comparative Examples 3 and 4. However, Comparative Examples 3 and 4 were not preferred because the adhesive strength was decreased over time.

(5) In Comparative Examples 5 and 6, the 30 μm thick double-sided tape (with a thermal conductivity of 0.3 W/m·K) was attached to one side of the graphite sheet, and the 30 μm thick single-sided adhesive film (with a thermal conductivity of 0.3 W/m·K) was attached to the other side of the graphite sheet. Therefore, since the double-sided tape and the single-sided adhesive film, both having a thickness of 30 μm, interfered with the heat transfer, the heat resistance and the LED temperature were lower in Examples 5 and 6 than in Comparative Examples 5 and 6.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for mounting a thermal diffusion sheet on a radiator plate, the thermal diffusion sheet comprising a graphite sheet and first and second thermally conductive adhesive layers attached to principal surfaces of the graphite sheet, the method comprising:

attaching a first surface of the first thermally conductive adhesive layer having a substantially same size as the graphite sheet to the radiator plate and a second surface of the first thermally conductive adhesive layer to a first surface of the graphite sheet; and sealing end faces of the graphite sheet and end faces of the first thermally conductive adhesive layer attached to the first surface of the graphite sheet by attaching the second thermally conductive adhesive layer to a second surface of the graphite sheet and attaching peripheral portions of the second thermally conductive adhesive layer to the radiator plate, wherein the second thermally conductive adhesive layer on the second surface of the graphite sheet is larger in size than the first thermally conductive adhesive layer on the first surface of the graphite sheet, and an entire periphery of the second thermally conductive adhesive layer on the second surface of the graphite sheet lies outside the graphite sheet, adhesive strength of the first and second thermally conductive adhesive layers on the first and the second surfaces of the graphite sheet, respectively, after exposure to 40° C. for 168 hours is reduced by no more than 20% relative to initial adhesive strength, and a hardened material of a polymer component included in the first and the second thermally conductive adhesive layers on the first and the second surfaces of the graphite sheet, respectively has a thermal conductivity of 0.6 W/m·K or more.

2. The method according to claim 1, wherein the graphite sheet has a thermal conductivity of 120 W/m·K or more in a lateral direction.

3. The method according to claim 1, wherein the graphite sheet has an emissive power of 0.3 to 0.95 at 40° C.

4. The method according to claim 1,
wherein the first and the second thermally conductive adhesive layers on the first and the second surfaces of the graphite sheet, respectively, comprise a compound obtained by adding a thermally conductive filler to the polymer compound, and
the polymer compound is at least one polymer selected from the group consisting of polysiloxane, polyacrylic, and polyolefin.

5. The method according to claim 1, wherein the initial adhesive strength of the first and second thermally conductive adhesive layers on the first and the second surfaces of the graphite sheet, respectively, is in a range of 0.5 to 10.0 N/cm.

6. The method according to claim 1, wherein the thermal diffusion sheet has a thermal resistance value of 0.2 to 5.0° C.·cm$^2$/W.

7. The method according to claim 1, wherein the thermal diffusion sheet has electrical insulation properties expressed as 200 MΩ or more.

8. The method according to claim 1, wherein the entire periphery of the second thermally conductive adhesive layer on the second surface of the graphite sheet lies at least 1 mm outside the first thermally conductive adhesive layer on the first surface of the graphite sheet.

9. The method according to claim 1, wherein the thermal diffusion sheet is wound around a reel.

* * * * *